(12) United States Patent
Chen et al.

(10) Patent No.: US 6,853,323 B1
(45) Date of Patent: Feb. 8, 2005

(54) DIFFERENTIAL VOLTAGE OUTPUT DIGITAL-TO-ANALOG CONVERTER

(75) Inventors: Yi-Huei Chen, Hsinchu (TW); Po-Chiun Huang, Hsinchu (TW); Chieh-Hung Chen, Hsinchu (TW)

(73) Assignee: Integrated Programmable Communications, Inc., Palo Alto, CA (US)

( * ) Notice: Subject to any disclaimer, the term of this patent is extended or adjusted under 35 U.S.C. 154(b) by 0 days.

(21) Appl. No.: 10/838,754

(22) Filed: May 4, 2004

(51) Int. Cl.$^7$ ............................................. H03M 1/66
(52) U.S. Cl. ........................ 341/144; 341/133; 341/136; 341/153
(58) Field of Search ......................... 341/133, 135, 341/136, 144, 153

(56) References Cited

U.S. PATENT DOCUMENTS 6,100,830 A  *  8/2000  Dedic ........................... 341/136
6,329,940 B1 * 12/2001  Dedic ........................... 341/144
6,603,417 B2 *  8/2003  Greig ........................... 341/136
6,621,432 B1 *  9/2003  Ganci ........................... 341/136
6,664,906 B2 * 12/2003  Volk ............................. 341/118

* cited by examiner

Primary Examiner—Michael Tokar
Assistant Examiner—Khai Nguyen
(74) Attorney, Agent, or Firm—Thomas, Kayden, Horstemeyer & Risley

(57) ABSTRACT

A digital-to-analog converter (DAC) for use in high-speed wireless communications. The DAC of the invention comprises a plurality of current steering cells to bi-directionally provide a differential current output. When the DAC sets the differential current output to zero for example, each of the current steering cells establishes dummy branches between a pair of current sources and thereby prevents the current sources from floating. This in turn enables the DAC to operate with a higher update rate.

10 Claims, 3 Drawing Sheets

DIFFERENTIAL VOLTAGE OUTPUT DIGITAL-TO-ANALOG CONVERTER

BACKGROUND OF THE INVENTION

1. Field of the Invention

The invention relates to integrated circuits, and more particularly to integrated circuits which convert a digital signal to an analog signal.

2. Description of the Related Art

As semiconductor manufacturing technology is rapidly progressing, it is possible to integrate analog and digital circuitry, which was previously implemented on a conventional board, on a single chip. Therefore, digital-to-analog converters (DACs), the interface between digital and analog systems, are regarded as key components in accomplishing integrated system design.

Digital-to-analog conversion refers to the process of converting discrete digital signals into a continuous-time range of analog signals. The trend in DACs is toward higher speeds and higher resolutions at reduced power levels. However, DACs tend to have relatively poor dynamic performance as they operate with high update rates. This is because the dynamic performance of a DAC is adversely affected by a "glitch". Transient voltages may appear at the DAC output due to the periodic code updates applied to the DAC. More succinctly, input code transitions for DACs frequently incur a glitch in the analog output. Glitches obscure the generation of the analog output representing the digital input code. This problem becomes pronounced particularly when the DACs operate at high frequencies. It is desirable to provide a DAC having significant reduction in the glitch. Furthermore, DACs employed in modern communications applications preferably offer the ability to control the common-mode voltage appearing on differential outputs. There is a need to provide a differential voltage output DAC, addressing the above-described requirements.

SUMMARY OF THE INVENTION

The present invention is generally directed to a digital-to-analog converter (DAC). According to one aspect of the invention, a differential voltage output DAC is disclosed. The DAC of the invention comprises a plurality of current steering cells and two differential output operational amplifiers. The current steering cells are jointly coupled at a first and second pair of output nodes and controlled by a first and second coded word. Each current steering cell comprises a pair of current sources, two differential input stages, and two bypass units. The current sources are employed to supply a pair of input currents substantially equal in magnitude. The two differential input stages are connected at the first pair of output nodes and in series between the current sources. In response to a corresponding bit of the first coded word and a corresponding bit of the second coded word, the differential input stages steer the pair of input currents through the first pair of output nodes at which the pair of input currents are opposite in direction. Thus a pair of complementary currents is developed at the first pair of output nodes. The two bypass units are connected at the second pair of output nodes and in series between the pair of current sources. When the corresponding bit of the first coded word and the corresponding bit of the second coded word are both in a predetermined state, the bypass units establish a pair of dummy branches in parallel with the differential input stages, whereby the input currents are diverted to the second pair of output nodes. The first differential output operational amplifier is connected to the first pair of output nodes at its noninverting and inverting input terminals. Arranged in transimpedance output configuration, the first operational amplifier not only converts the total complementary currents into a differential voltage signal but also maintains the first pair of output nodes fixed at a predetermined voltage. The second differential output operational amplifier is connected to the second pair of output nodes at its noninverting and inverting input terminals. Similarly, the second operational amplifier is arranged in transimpedance output configuration to maintain the second pair of output nodes fixed at the predetermined voltage.

According to another aspect of the invention, a digital-to-analog converter comprises a plurality of current steering cells under control of a first and second coded word. The current steering cells are jointly coupled at a first and second pair of output nodes. Each current steering cell comprises a pair of current sources, two differential input stages, and two bypass units. The current sources are employed to supply a pair of input currents substantially equal in magnitude. The two differential input stages are connected at the first pair of output nodes and in series between the current sources. In response to a corresponding bit of the first coded word and a corresponding bit of the second coded word, the differential input stages steer the pair of input currents through the first pair of output nodes at which the pair of input currents are opposite in direction. Thus a pair of complementary currents is developed bi-directionally at the first pair of output nodes. The two bypass units are connected at the second pair of output nodes and in series between the pair of current sources. When the corresponding bit of the first coded word and the corresponding bit of the second coded word are both in a predetermined state, the bypass units establish a pair of dummy branches in parallel with the differential input stages, whereby the input currents are diverted to the second pair of output nodes. This prevents the pair of current sources from floating.

DESCRIPTION OF THE DRAWINGS

The present invention will be described by way of exemplary embodiments, but not limitations, illustrated in the accompanying drawings in which like references denote similar elements, and in which.

DETAILED DESCRIPTION OF THE INVENTION

Reference throughout this specification to "one embodiment" or "an embodiment" indicates that a particular feature, structure, or characteristic described in connection with the embodiments is included in at least one embodiment of the present invention. Thus, the appearance of the phrases "in one embodiment" or "an embodiment" in various places throughout this specification is not necessarily all referring to the same embodiment. Furthermore, the particular features, structures, or characteristics may be combined in one or more embodiments. As to the accompanying drawings, it should be appreciated that not all components necessary for a complete implementation of a practical system are illustrated or described in detail. Rather, only those components necessary for a thorough understanding of the invention are illustrated and described. Furthermore, components which are either conventional or may be readily designed and fabricated in accordance with the teachings provided herein are not described in detail.

Figure 1:
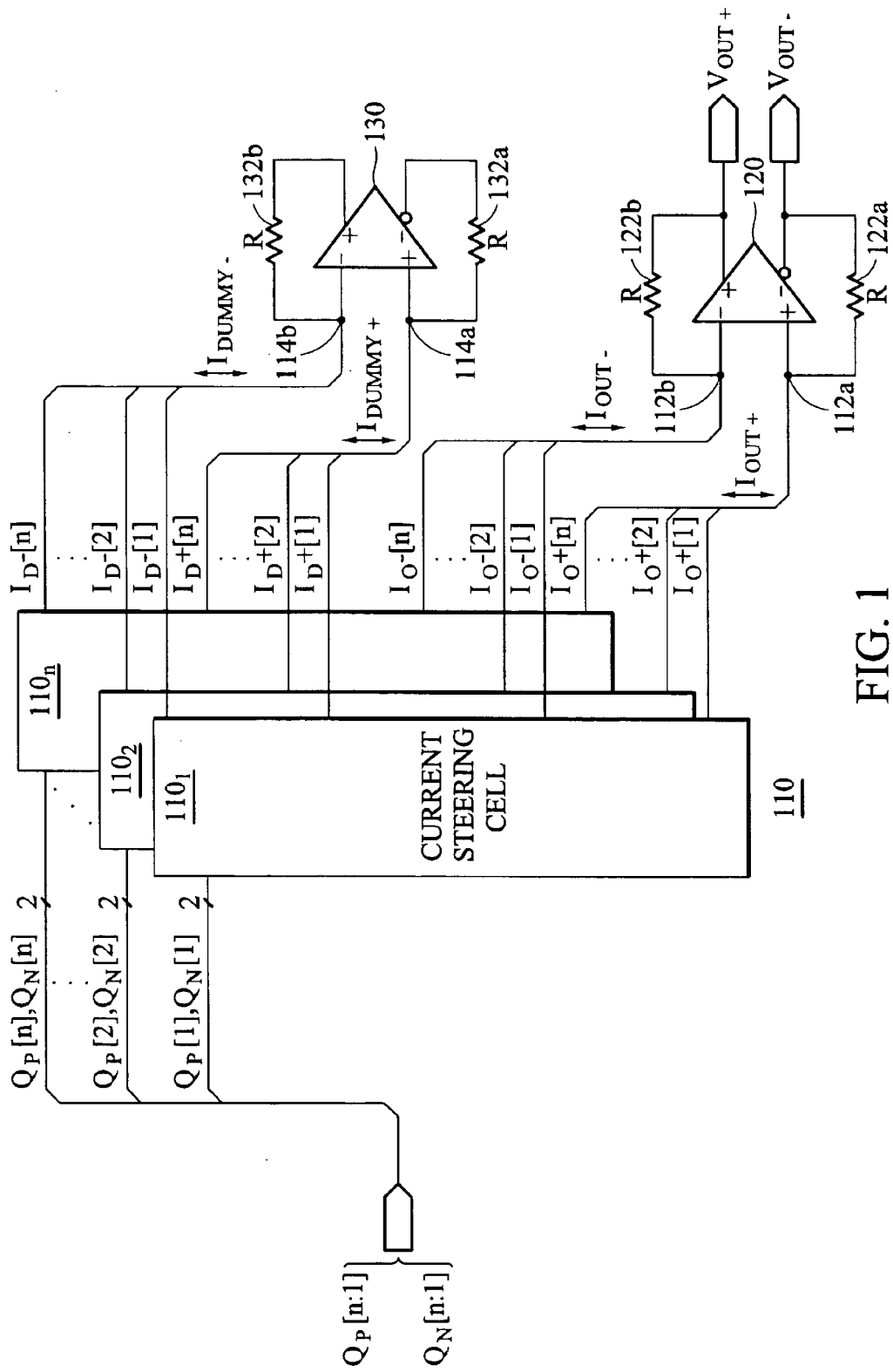
FIG. 1 is a block diagram of a differential voltage output digital-to-analog converter according to an embodiment of the invention.

FIG. 1 shows a differential voltage output DAC 100 of the invention. The DAC 100 comprises n number of current steering cells $110_1$–$110_n$ under control of two n-bit coded words $Q_p[n:1]$ and $Q_n[n:1]$. In one embodiment, a decoder (not shown) first converts a digital input code into $Q_p[n:1]$ and $Q_N[n:1]$ in the form of thermometer code, which, in turn, improves the dynamic performance and linearity of the DAC 100. The thermometer decoder is beyond the scope of the invention and is not described in detail herein. As depicted, the current steering cells $110_1$–$110_n$ are jointly coupled at a pair of output nodes 112a–b and another pair of output nodes 114a–b. Each of the current steering cells $110_{1-110n}$ accepts a corresponding bit $Q_p[m]$ of coded word $Q_p[n:1]$ and a corresponding bit $Q_N[m]$ of coded word $Q_N[n:1]$, where m=1, 2, . . . , n. Depending on $Q_p[m]$ and $Q_N[m]$, the mth current steering cell $110_m$ renders a pair of complementary currents $I_{D+}[m]$ and $I_{O-}[m]$ to the output nodes 112a–b, or renders another pair of complementary currents $I_{D+}[m]$ and $I_{D-}[m]$ to the output nodes 114a–b. All complementary currents $I_{o+}[n:1]$ and $I_o[n:1]$ are summed at the output nodes 112a–b, respectively, so as to form a pair of complementary output currents $I_{OUT+}$ and $I_{OUT-}$ that represent a digital input code. Likewise, complementary currents $I_D[n:1]$ and $I_D[n:1]$ are summed at the output nodes 114a–b, respectively, thus forming a pair of complementary dummy currents $I_{DUMMY+}$ and $I_{DUMMY-}$. Double-headed arrows in accompanying drawings here denote bi-directional currents. A differential output operational amplifier 120 and two resistors 122a–b are set up as a current-to-voltage converter. In this way, the complementary output currents $I_{OUT+}$ and $I_{OUT-}$ are converted into a differential voltage signal, $V_{OUT+}$ and $V_{OUT-}$. Note that differential output operational amplifier 130 and resistors 132a–b are arranged in a similar manner and serve as a counterpart to eliminate glitches in the differential voltage outputs $V_{OUT+}$ and $V_{OUT-}$.

Figure 2:
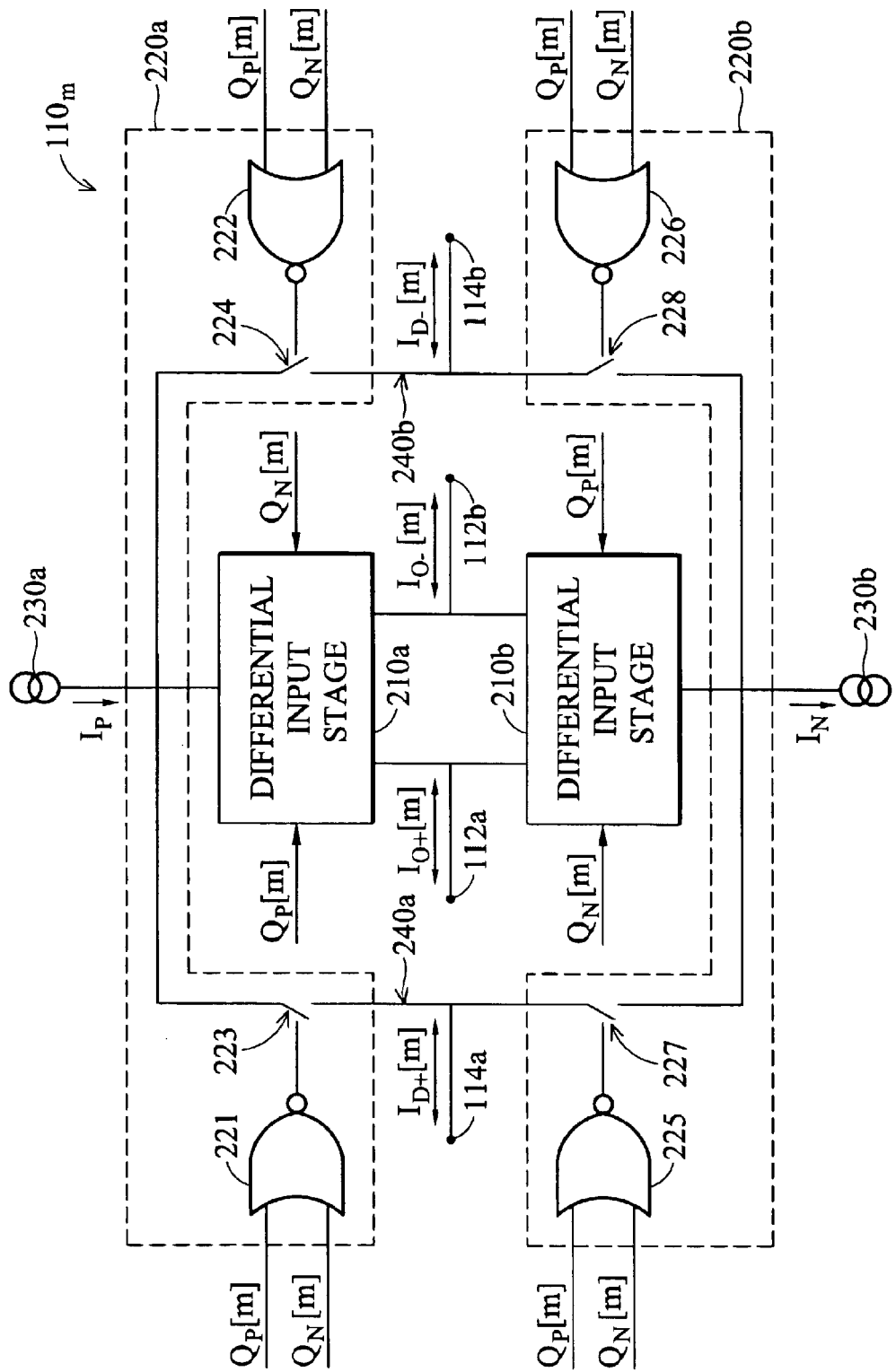
FIG. 2 is a simplified diagram of a current steering cell according to an embodiment of the invention.

Fig. 2 is a block diagram illustrating one of the current steering cells according to an embodiment of the invention. The mth current steering cell 110m comprises a pair of differential input stages 210a and 210b. The differential input stages 210a–b are connected at the pair of output nodes 112a–b, and are connected in series between a pair of current sources 230a–b supplying a pair of input currents $I_p$ and $I_N$ of equal magnitude. In response to $Q_p[m]$ and $Q_N[m]$, the differential input stages 210a and 210b steer the pair of input currents $I_p$ and $I_N$ through the pair of output nodes 112a–b at which the currents $I_p$ and $I_N$ are opposite in direction. For example, the input current $I_p$ is steered to the node 112a and the input current $I_N$ is steered away from the node 112b when $Q_p[m]$ is logical "1" and $Q_N[m]$ is logical "0". Conversely, the input current $I_p$ is steered to the node 112b and the input current $I_N$ is steered away from the node 112a when $Q_p[m]$ is logical "0" and $Q_N[m]$ is logical "1". With the use of the differential input stage pair, the complementary currents $I_o[m]$ and $I_{o-}[m]$ are bi-directionally developed at the nodes 112a–b, and are suitable for common-mode voltage control.

With continued reference to FIG. 2, the mth current steering cell $110_m$ preferably includes a pair of bypass units 220a–b connected together at the pair of output nodes 114a–b and in series between the pair of current sources 230a–b. In one embodiment, the bypass unit 220a comprises two switch devices 223–224 and two NOR gates 221–222. Similarly, the bypass unit 220b comprises two switch devices 227–228 and two NOR gates 225–226. However, this is merely an example and embodiments of the present invention are not limited in this respect. As depicted, all of the NOR gates receive $Q_p[m]$ and $Q_N[m]$ as input. The switch device 223 has a control terminal coupled to receive the output of the NOR gate 221, an input terminal coupled to the current source 230a, and an output terminal coupled to the output node 114a. The switch device 224 has a control terminal coupled to receive the output of the NOR gate 222, an input terminal coupled to the input terminal of the current source 230a, and an output terminal coupled to the output node 114b. The switch device 227 has a control terminal coupled to the output of the NOR gate 225, an input terminal coupled to the output node 114a, and an output terminal coupled to the current source 230b. The switch device 228 has a control terminal coupled to the output of the NOR gate 226, an input terminal coupled to the output node 114b, and an output terminal coupled to the current source 230b. When $Q_p[m]$ and $Q_N[m]$ are both in a predetermined state, the mth current steering cell 110, is inhibited from delivering the complementary currents $I_o+[m]$ and $I_o[m]$. For example, in the case where both $Q_p[m]$ and $Q_N[m]$ are logical "0", all of the switch devices are turned on accordingly while the differential input stages 210a–b are deactivated. Hence, the bypass units 220a–b establish a pair of dummy branches 240a–b in parallel with the differential input stages 210a–b, whereby the input currents $I_p$ and $I_N$ are diverted through the output nodes 114a–b. This prevents the current sources 230a–b from floating, which, in turn, enables the DAC 100 to operate with a higher update rate. It should be understood by one skilled in the art that there are other ways of accomplishing the same result, and the method will vary based upon the type of device chosen to make up the bypass units.

Figure 3:
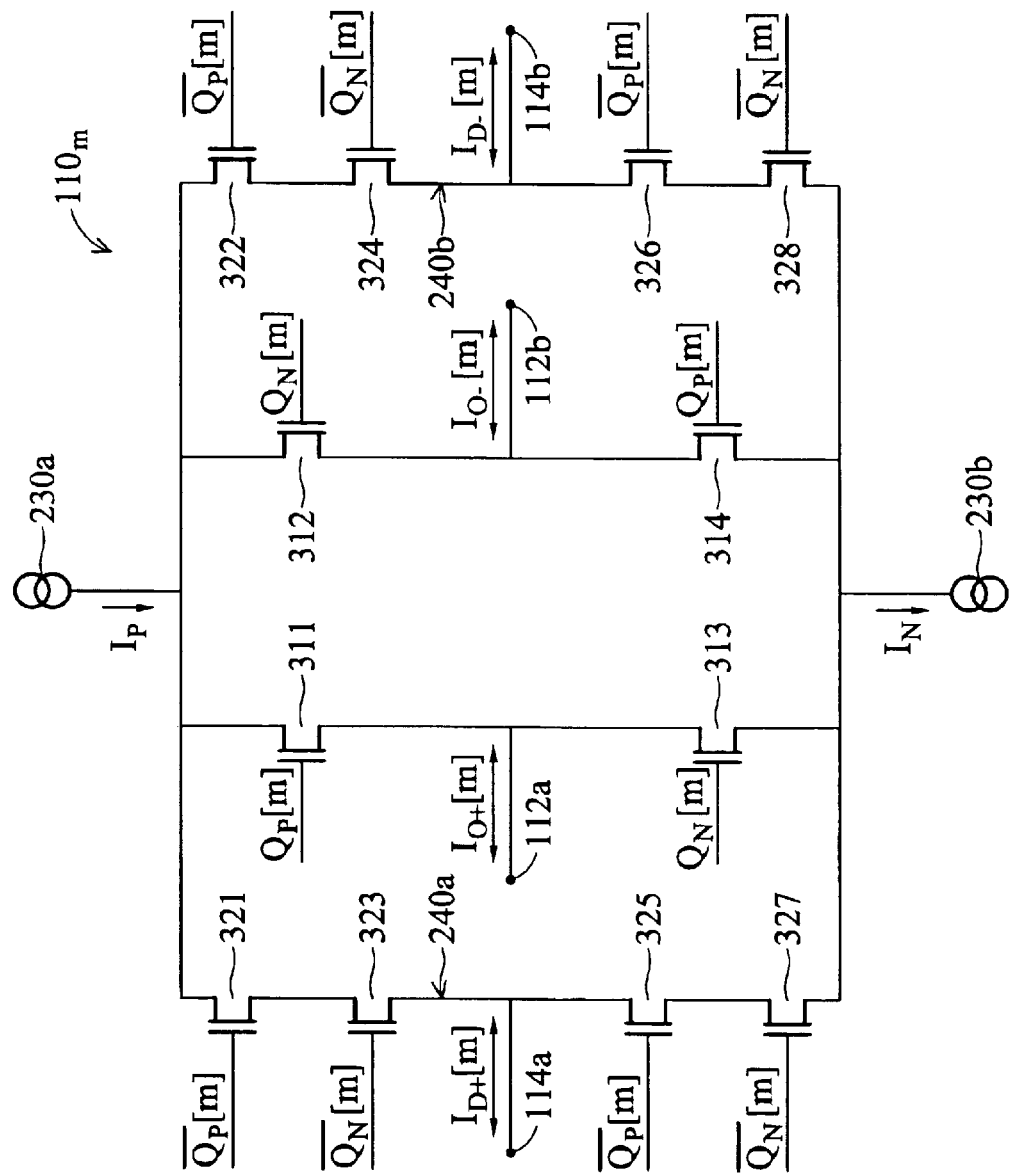
FIG. 3 is a schematic diagram of a current steering cell according to an embodiment of the invention.

FIG. 3 shows a schematic diagram of the mth current steering cell $110_m$. The differential input stage 210a comprises transistors 311 and 312; the differential input stage 210a comprises transistors 313 and 314. Each transistor described herein is either a p-channel or n-channel MOS transistor having a gate, a drain and a source. Since a MOS transistor is typically a symmetrical device, the true designation of "source" and "drain" is only possible once a voltage is impressed on the terminals. The designations of source and drain herein should be interpreted, therefore, in the broadest sense. The transistor 331 has a gate coupled to receive $Q_p[m]$, a drain coupled to the current source 230a, and a source coupled to the output node 112a. The transistor 312 has a gate coupled to receive $Q_N[m]$, a drain coupled to the current source 230a, and a source coupled to the output node 112a. The transistor 313 has a gate coupled to receive $Q_N[m]$, a drain coupled to the output node 112a, and a source coupled to the current source 230b. The transistor 314 has a gate coupled to receive $Q_p[m]$, a drain coupled to the output node 112b, and a source coupled to the current source 230b. According to an alternative embodiment of the invention, the bypass unit 220a comprises transistors 321–324, and the bypass unit 220b comprises transistors 325–328. The transistors 321, 323, 325 and 327 are connected in series between the pair of current sources 230a–b. Likewise, the transistors 322, 324, 326 and 328 are connected in series between the pair of current sources 230a–b. The gates of the transistors 321, 322, 325 and 326 are coupled to receive a complement of $Q_p[m]$, i.e. $\overline{Q_p}[m]$, while the transistors 323, 324, 327 and 328 have their gates coupled to receive a complement of $Q_N[m]$, i.e. $\overline{Q_N}[m]$.

In operation, when $Q_p[m]$ is logical "1" and $Q_N[m]$ is logical "0", the transistors 311 and 314 are made conductive, but the transistors 312 and 313 are made nonconductive. Thus the input current $I_N$ is steered to the node 112a and the input current $I_N$ is steered away from the node 112b. According to Kirchhoff's current law, currents directed toward a node are usually taken as positive and those directed away are taken as negative. In the above case, the direction of the current $I_o[m]$ is positive while the direction of the current $I_o[m]$ is negative. When $Q_P[m]$ is logical "0" and $Q_N[m]$ is logical "1", the transistors 311 and 314 are made nonconductive, but the transistors 312 and 313 become conductive. Thus the input current $I_P$ is steered to the node 112b and the input current $I_N$ is steered away from the node 112a. As a result, the direction of the current $I_{o+}[m]$ is negative while the direction of the current $I_o[m]$ is positive. Furthermore, in the case where both $Q_P[m]$ and $Q_N[m]$ are logical "0", the transistors 321–328 become conductive while the transistors 311–314 are made nonconductive accordingly. The input currents $I_P$ and $I_N$ are shunted to the dummy branches 240a–b and no current reaches the output nodes 112a–b. It should be appreciated by one skilled in the art that other transistor technologies are contemplated for implementing the transistors illustrated in FIG. 3 based upon the principles of the invention.

Returning to FIG. 1, the operational amplifier 120 is arranged in transimpedance output configuration and connected to the pair of output nodes 112a–b at its noninverting and inverting input terminals. The two input terminals of the operational amplifier 120 may track each other in potential because of the operational amplifier 120 being in the form of "negative feedback", that is, a "virtual short circuit" exists between its noninverting and inverting input terminals. A "virtual short circuit" means that whatever voltage at the noninverting input terminal will automatically appear at the inverting input terminal. Hence, not only does the operational amplifier 120 convert the complementary output currents $I_{OUT+}$ and $I_{OUT-}$ into the differential voltage outputs $V_{OUT+}$ and $V_{OUT-}$, it maintains the output nodes 112a–b fixed at a common-mode voltage of $V_{OUT+}$ and $V_{OUT-}$. Another operational amplifier 130 is connected to the second pair of output nodes 114a–b at its noninverting and inverting input terminals. In similar fashion, the operational amplifier is arranged in transimpedance output configuration to maintain the output nodes 114a–b fixed at the common-mode voltage. Therefore, the DAC of the invention significantly reduces glitches in the differential voltage outputs $V_{OUT+}$ and $V_{OUT-}$.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A differential voltage output digital-to-analog converter comprising:
    a plurality of current steering cells under control of a first and second coded word, jointly coupled at a first and second pair of output nodes, each of the cells comprising:
        a pair of current sources supplying a pair of input currents substantially equal in magnitude;
        a first and second differential input stage connected at the first pair of output nodes and in series between the pair of current sources, responsive to a corresponding bit of the first coded word and a corresponding bit of the second coded word, for steering the pair of input currents through the first pair of output nodes at which the pair of input currents are opposite in direction, and thus a pair of complementary currents is developed at the first pair of output nodes; and
        a first and second bypass unit connected at the second pair of output nodes and in series between the pair of current sources, for establishing a pair of dummy branches in parallel with the first and the second differential input stages when the corresponding bit of the first coded word and the corresponding bit of the second coded word are both in a predetermined state, whereby the pair of input currents are diverted to the second pair of output nodes;
    a first differential output operational amplifier comprising a noninverting and inverting input terminal connected to the first pair of output nodes, arranged in transimpedance output configuration to convert the total complementary currents into a differential voltage signal and to maintain the first pair of output nodes fixed at a predetermined voltage; and
    a second differential output operational amplifier comprising a noninverting and inverting input terminal connected to the second pair of output nodes, arranged in transimpedance output configuration to maintain the second pair of output nodes fixed at the predetermined voltage.

2. The digital-to-analog converter of claim 1 wherein the first differential input stage comprises a first and second transistor, the second differential input stage comprises a third and fourth transistor, wherein:
    the first transistor has a gate coupled to receive the corresponding bit of the first coded word, a drain coupled to one of the pair of current sources, and a source coupled to one of the first pair of output nodes;
    the second transistor has a gate coupled to receive the corresponding bit of the second coded word, a drain coupled to the drain of the first transistor, and a source coupled to the other of the first pair of output nodes;
    the third transistor has a gate coupled to receive the corresponding bit of the second coded word, a drain coupled to the source of the first transistor, and a source coupled to the other of the pair of current sources; and
    the fourth transistor has a gate coupled to receive the corresponding bit of the first coded word, a drain coupled to the source of the second transistor, and a source coupled to the source of the third transistor.

3. The digital-to-analog converter of claim 1 wherein the first bypass unit comprises a first and second switch device, the second bypass unit comprises a third and fourth switch device, wherein:
    the first switch device comprises a control terminal coupled to receive a logical-NOR result of the two corresponding bits of the first and the second coded words, an input terminal coupled to one of the pair of current sources, and an output terminal coupled to one of the first pair of output nodes;
    the second switch device comprises a control terminal coupled to receive the logical-NOR result of the two corresponding bits of the first and the second coded words, an input terminal coupled to the input terminal of the first switch device, and an output terminal coupled to the other of the first pair of output nodes;
    the third switch device comp rises a control terminal coupled to receive the logical-NOR result of the two corresponding bits of the first and the second coded words, an input terminal coupled to the output terminal of the first switch device, and an output terminal coupled to the other of the pair of current sources; and the fourth switch device comprises a control terminal coupled to receive the logical-NOR result of the two corresponding bits of the first and the second coded words, an input terminal coupled to the output terminal of the second switch device, and an output terminal coupled to the output terminal of the third switch device.

4. The digital-to-analog converter of claim 1 wherein the first bypass unit comprises a first, second, third and fourth transistor, the second bypass unit comprises a fifth, sixth, seventh and eighth transistor, wherein:

the first, the third, the fifth, and the seventh transistors are connected in series between the pair of current sources;

the second, the fourth, the sixth, and the eighth transistors are connected in series between the pair of current sources;

the first, the second, the fifth, and the sixth transistors have their gates coupled to receive a complement of the corresponding bit of the first coded word; and the third, the fourth, the seventh, and the eighth transistors have their gates coupled to receive a complement of the corresponding bit of the second coded word.

5. The digital-to-analog converter of claim 1 wherein the first and the second coded words are in a thermometer code format and decoded from a plurality of input bits.

6. A digital-to-analog converter comprising:

a plurality of current steering cells under control of a first and second coded word, jointly coupled at a first and second pair of output nodes, each of the cells comprising:

a pair of current sources supplying a pair of input currents substantially equal in magnitude;

a first and second differential input stage connected at the first pair of output nodes and in series between the pair of current sources, responsive to a corresponding bit of the first coded word and a corresponding bit of the second coded word, for steering the pair of input currents through the first pair of output nodes at which the pair of input currents are opposite in direction, and thus a pair of differential currents is developed bi-directionally at the first pair of output nodes; and a first and second bypass unit connected at the second pair of output nodes and in series between the pair of current sources, for establishing a pair of dummy branches in parallel with the first and the second differential input stages when the corresponding bit of the first coded word and the corresponding bit of the second coded word are both in a predetermined state, whereby the pair of input currents are diverted to the second pair of output nodes, preventing the pair of current sources from floating.

7. The digital-to-analog converter of claim 6 wherein the first differential input stage comprises a first and second transistor, the second differential input stage comprises a third and fourth transistor, wherein:

the first transistor has a gate coupled to receive the corresponding bit of the first coded word, a drain coupled to one of the pair of current sources, and a source coupled to one of the first pair of output nodes;

the second transistor has a gate coupled to receive the corresponding bit of the second coded word, a drain coupled to the drain of the first transistor, and a source coupled to the other of the first pair of output nodes;

the third transistor has a gate coupled to receive the corresponding bit of the second coded word, a drain coupled to the source of the first transistor, and a source coupled to the other of the pair of current sources; and the fourth transistor has a gate coupled to receive the corresponding bit of the first coded word, a drain coupled to the source of the second transistor, and a source coupled to the source of the third transistor.

8. The digital-to-analog converter of claim 6 wherein the first bypass unit comprises a first and second switch device, the second bypass unit comprises a third and fourth switch device, wherein:

the first switch device comprises a control terminal coupled to receive a logical-NOR result of the two corresponding bits of the first and the second coded words, an input terminal coupled to one of the pair of current sources, and an output terminal coupled to one of the first pair of output nodes;

the second switch device comprises a control terminal coupled to receive the logical-NOR result of the two corresponding bits of the first and the second coded words, an input terminal coupled to the input terminal of the first switch device, and an output terminal coupled to the other of the first pair of output nodes;

the third switch device comprises a control terminal coupled to receive the logical-NOR result of the two corresponding bits of the first and the second coded words, an input terminal coupled to the output terminal of the first switch device, and an output terminal coupled to the other of the pair of current sources; and the fourth switch device comprises a control terminal coupled to receive the logical-NOR result of the two corresponding bits of the first and the second coded words, an input terminal coupled to the output terminal of the second switch device, and an output terminal coupled to the output terminal of the third switch device.

9. The digital-to-analog converter of claim 6 wherein the first bypass unit comprises a first, second, third and fourth transistor, the second bypass unit comprises a fifth, sixth, seventh and eighth transistor, wherein:

the first, the third, the fifth, and the seventh transistors are connected in series between the pair of current sources;

the second, the fourth, the sixth, and the eighth transistors are connected in series between the pair of current sources;

the first, the second, the fifth, and the sixth transistors have their gates coupled to receive a complement of the corresponding bit of the first coded word; and the third, the fourth, the seventh, and the eighth transistors have their gates coupled to receive a complement of the corresponding bit of the second coded word.

10. The digital-to-analog converter of claim 6 wherein the first and the second coded words are in a thermometer code format and decoded from a plurality of input bits.

* * * * *